(12) United States Patent
Cho et al.

(10) Patent No.: US 7,696,819 B2
(45) Date of Patent: Apr. 13, 2010

(54) SWITCHED-CAPACITOR VARIABLE GAIN AMPLIFIER HAVING HIGH VOLTAGE GAIN LINEARITY

(75) Inventors: Young Kyun Cho, Daejeon (KR); Young Deuk Jeon, Daejeon (KR); Jong Kee Kwon, Daejeon (KR); Jong Dae Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 10 days.

(21) Appl. No.: 12/195,212

(22) Filed: Aug. 20, 2008

(65) Prior Publication Data

US 2009/0091387 A1 Apr. 9, 2009

(30) Foreign Application Priority Data

Oct. 5, 2007 (KR) .................. 10-2007-0100603

(51) Int. Cl.
*H03F 1/36* (2006.01)
(52) U.S. Cl. ............................... 330/86; 330/9
(58) Field of Classification Search .................. 330/86, 330/9, 69, 254
See application file for complete search history.

(56) References Cited

U.S. PATENT DOCUMENTS

| | | | |
|---|---|---|---|
| 6,628,164 B2 | 9/2003 | Ramesh et al. | |
| 6,768,374 B1 * | 7/2004 | Lee | 330/9 |
| 6,778,009 B1 * | 8/2004 | Lee | 330/9 |
| 6,897,720 B2 | 5/2005 | Fujimoto | |
| 6,919,760 B2 | 7/2005 | Ogita et al. | |
| 6,940,342 B2 | 9/2005 | Ramesh et al. | |
| 7,295,143 B2 * | 11/2007 | Ambo et al. | 341/172 |

FOREIGN PATENT DOCUMENTS

| | | |
|---|---|---|
| JP | 06-164323 A | 6/1994 |
| JP | 2000-114896 A | 4/2000 |
| KR | 1020000074616 A | 12/2000 |
| KR | 1020060131395 A | 12/2006 |

OTHER PUBLICATIONS

Yoshihisa Fujimoto et al., "A Switched-Capacitor Variable Gain Amplifier for CCD Image Sensor Interface System", ESSCIRC 2002, pp. 363-366.
Ramesh Harjani, "A Low-Power CMOS VGA for 50Mb/s Disk Drive Read Channesl", IEEE Tran. Circuit and System II (1995).
Katsu Nakamura, "A CMOS Analog Front-End Chip-Set for Mega Pixel Camcorders", 2000 IEEE International Solid-State Circuits Conference.
Bhupendra K. Ahuja et al., "A 30Msample/s 12b 110mW Video Analog Front End for Digital Camera", ISSCC 2002/ Session 26/ MEMS and Displays/26.7, 2002 IEEE International Solid-State Circuits Conference.

\* cited by examiner

*Primary Examiner*—Henry K Choe

(57) ABSTRACT

Provided is a switched-capacitor variable gain amplifier having high voltage gain linearity. According to the above amplifier, a sampling capacitor is shared and used at a sampling phase and an amplification phase, and thus a voltage gain error caused by capacitor mismatch can be reduced. Also, using a unit capacitor array enables circuit design and layout to be simplified. Further, in the amplifier, a voltage gain can be easily controlled to be more or less than 1, as necessary, and power consumption and kT/C noise can be reduced by a feedback factor that is relatively large, so that gain amplification performance can be improved.

11 Claims, 7 Drawing Sheets

SWITCHED-CAPACITOR VARIABLE GAIN AMPLIFIER HAVING HIGH VOLTAGE GAIN LINEARITY

CROSS-REFERENCE TO RELATED APPLICATION

This application claims priority to and the benefit of Korean Patent Application No. 2007-100603, filed Oct. 5, 2007, the disclosure of which is incorporated herein by reference in its entirety.

BACKGROUND

1. Field of the Invention

The present invention relates to a switched-capacitor variable gain amplifier having high voltage gain linearity, and more particularly, to a variable gain amplifier having a limited gain step and small gain nonlinearity in a large gain section.

The present invention is derived from a project entitled "Elements and Module for Ubiquitous Terminal [2006-S-006-02]" conducted as an IT R&D program for the Ministry of Information and Communication/Institute for Information and Technology Advancement (Republic of Korea).

2. Discussion of Related Art

A variable gain amplifier (VGA) is a circuit in which a front end of a signal processing circuit adjusts the amplitude of an input signal to keep it within a dynamic range of the signal processing circuit or to give it a specified value. For example, when an analog voice or image signal is processed in an analog circuit, a VGA may be used to adjust the amplitude of an input signal to prevent saturation of an output signal. Also, when an input digital signal input through a channel is attenuated, which causes considerable loss in a digital circuit, a VGA may be used to amplify the digital signal to comply with specifications.

FIG. 1A is a circuit diagram illustrating a conventional VGA 100 having a switched-capacitor structure, and FIG. 1B illustrates an array of gain capacitors of the VGAs 100 illustrated in FIG. 1A.

Referring to FIG. 1A, the conventional VGA 100 includes an operational amplifier 110 for amplifying a difference between two input voltages, and digital-to-analog converters (DACs) 120A and 120B for adjusting a voltage input to the operational amplifier 110 to adjust an amplification rate.

However, in the VGA 100 having the above structure, in order to obtain a limited gain step, an array of DAC capacitors 120A and 120B having various sizes is required. That is, as illustrated in FIG. 1B, in order to control a voltage gain having a dB-linearity of 9-bit, 10 different capacitors including 9 gain capacitors (C1 to C9) and a scaling capacitor $C_b$ other than a sampling capacitor $C_s$ and a feedback capacitor $C_f$ should be used.

However, the array of different-sized capacitors complicates circuit design and layout. Also, independently using a sampling capacitor $C_s$ and a feedback capacitor $C_f$ may cause mismatch when an extremely small voltage gain step is implemented. In addition, in a conventional VGA, since a feedback factor of a capacitor array has a small value, more power is required to obtain the same unit gain frequency.

In view of these drawbacks, an exponential gain control variable gain amplifier using a unit capacitor array and a positive feedback method has been suggested.

FIG. 2A is a circuit diagram illustrating a conventional VGA 200 having an exponential gain control structure, and FIG. 2B illustrates a gain capacitor array of the VGA 200 illustrated in FIG. 2A.

Referring to FIGS. 2A and 2B, the VGA 200 having an exponential gain control structure controls actual values of the capacitor array by first order approximation of an exponential function in the variable gain amplifier having the switched-capacitor structure (refer to FIGS. 1A and 1B). Since unit capacitors constitute the capacitor array, a gain step control circuit can be easily obtained, and a relatively large feedback factor can be obtained, so that power consumption can be reduced.

Here, the first order approximation of an exponential function can be represented by the following Equation 1.

$$e^{2x} \simeq \frac{1+x}{1-x} \quad \text{[Equation 1]}$$

According to Equation 1, to implement a function of the form (1+x)/(1−x), a value of a feedback variable capacitor $C_x$ can be represented as a negative value (−x).

For this purpose, the VGA 200 having the exponential gain control structure should have a variable capacitor $C_x$ connected to a negative output voltage −Vout rather than to a positive output voltage +Vout, so that the variable capacitor $C_x$ has a negative value at an input part of the operational amplifier 210. That is, the variable capacitor $C_x$ having a negative value necessary for first order approximation of an exponential function can be implemented through a capacitor array having the positive feedback structure.

The voltage gain of the VGA 200 having the exponential gain control structure can be represented by the following Equation 2:

$$A_v = \frac{C_a + C_x}{C_a - C_x} \quad \text{[Equation 2]}$$

According to Equation 2, in order to obtain a gain of 0 dB or lower, i.e., a gain between 0 and 1, the variable capacitor $C_x$ should have a negative capacitance.

However, since no capacitor has a negative capacitance, it is impossible to implement a voltage gain of 0 dB or lower using the VGA 200 having the exponential gain control structure, and thus a large input voltage may result in a malfunction.

SUMMARY OF THE INVENTION

The present invention is directed to a switched-capacitor variable gain amplifier capable of reducing a voltage gain error according to capacitor mismatch, and minimizing power consumption according to a large feedback factor.

The present invention is also directed to a switched-capacitor variable gain amplifier capable of simplifying circuit design and layout.

The present invention is further directed to a switched-capacitor variable gain amplifier capable of easily controlling a voltage gain taking into account a large input voltage.

One aspect of the present invention provides a variable gain amplifier including: first and second sampling capacitor modules, each module including a first sampling capacitor and a first variable capacitor and storing each input voltage at a sampling phase; an operational amplifier amplifying a difference between the input voltages at an amplification phase; first and second amplification capacitor modules respectively sharing the first sampling capacitor with the first and second sampling capacitor modules, and determining a voltage gain value of the input voltage according to capacitances of the shared first sampling capacitor, a second variable capacitor, and an auxiliary capacitor; and a plurality of sampling switches and a plurality of amplification switches, which are respectively opened and closed at the sampling and amplification phases, wherein the first and second variable capacitors have variable capacitance values depending on switching of a unit capacitor array.

When the input voltage is equal to or higher than a predetermined critical value, the capacitance of the auxiliary capacitor may be set to a limited value so that the voltage gain value becomes less than 1, and when the input voltage is lower than the predetermined critical value, the capacitance of the auxiliary capacitor may be set to 0 so that the voltage gain value becomes 1 or higher.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which.

DETAILED DESCRIPTION OF EMBODIMENTS

The present invention will now be described more fully hereinafter with reference to the accompanying drawings, in which exemplary embodiments of the invention are shown. This invention may, however, be embodied in different forms and should not be construed as limited to the exemplary embodiments set forth herein.

Figure 3A:
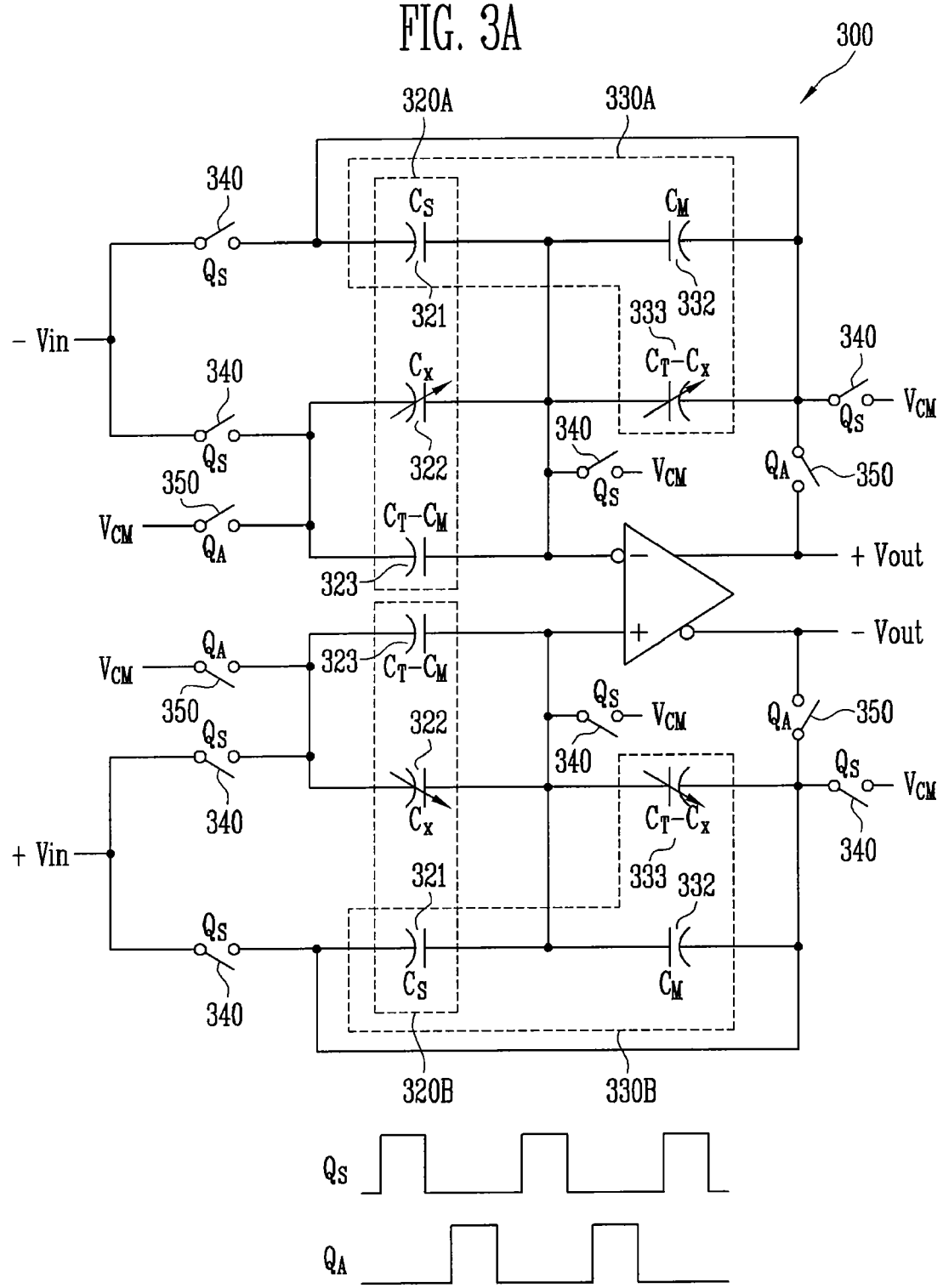
FIG. 3A illustrates the configuration and operation of a variable gain amplifier according to an exemplary embodiment of the present invention.
Figure 3B:
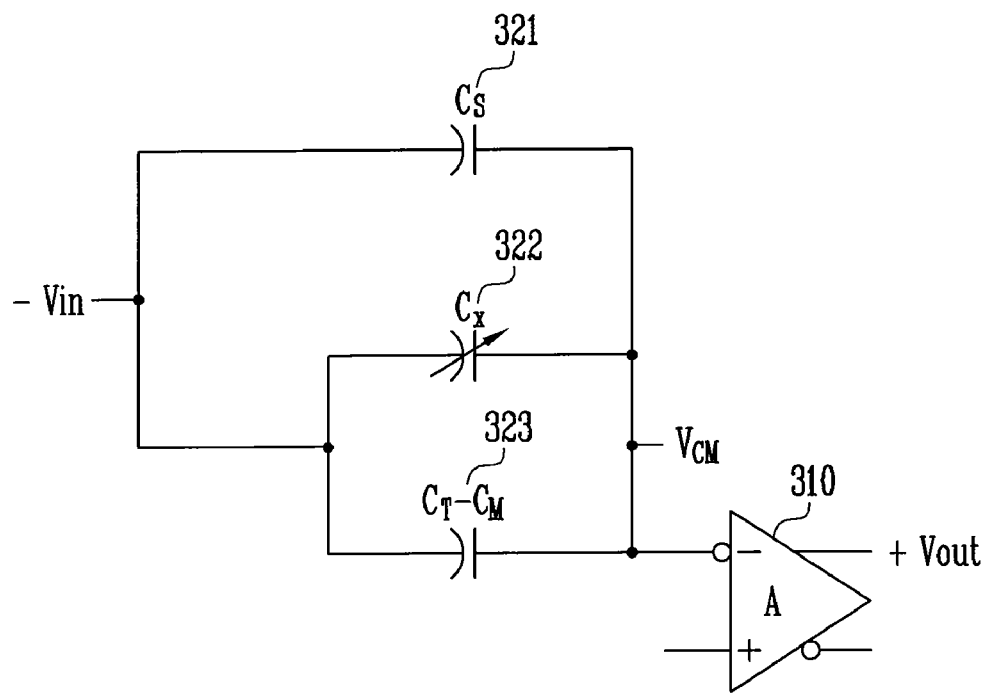
FIGS. 3B and 3C illustrate operations of the variable gain amplifier illustrated in FIG. 3A at a sampling phase and an amplification phase.
Figure 3C:
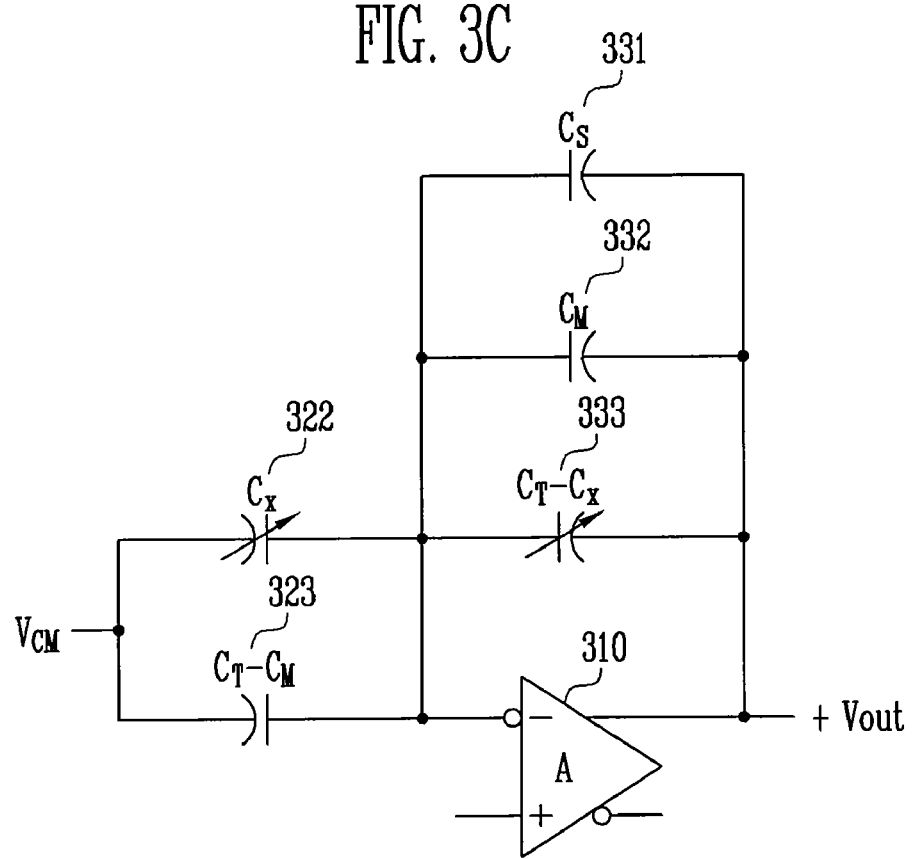

FIG. 3A illustrates the configuration and operation of a variable gain amplifier 300 according to an exemplary embodiment of the present invention, FIGS. 3B and 3C illustrate operations of the variable gain amplifier 300 at a sampling phase $Q_S$ and an amplification phase $Q_A$, and circuits related to an inverting input only are illustrated for clarity.

Referring to FIG. 3A, the variable gain amplifier 300 according to an exemplary embodiment of the present invention includes an operational amplifier 310 amplifying a difference between input voltages +Vin and −Vin, first and second sampling capacitor modules 320A and 320B respectively storing the input voltages +Vin and −Vin at the sampling phase $Q_S$, first and second amplification capacitor modules 330A and 330B determining voltage gain values of the input voltages +Vin and −Vin, a plurality of sampling switches 340 that are opened and closed in the sampling phase $Q_S$, and a plurality of amplification switches 350 that are opened and closed at the amplification phase $Q_A$.

The configuration and operation of the second sampling capacitor module 320B and the second amplification capacitor module 330B are the same as those of the first sampling capacitor module 320A and the first amplification capacitor module 330A, except for the connection to a positive input voltage +Vin, and thus only operations of the first sampling capacitor module 320A and the first amplification capacitor module 330A will be described below.

The first sampling capacitor module 320A includes a first sampling capacitor 321 having a capacitance value of $C_S$, a first variable capacitor 322 having a variable capacitance value of $C_x$, and a second sampling capacitor 323 having a capacitance value of $C_T$–$C_M$.

The first amplification capacitor module 330A includes the first sampling capacitor 321 having a capacitance value of $C_S$, an auxiliary capacitor 332 having a capacitance value of $C_M$, and a second variable capacitor 333 having a variable capacitance value of $C_T$–$C_x$.

That is, the first sampling capacitor module 320A and the first amplification capacitor module 330A share the first sampling capacitor 321, and thus the first sampling capacitor 321 is used both at the sampling phase $Q_S$ and the amplification phase $Q_A$, as illustrated in FIGS. 3B and 3C.

As described above, since the first sampling capacitor 321 can be shared and used at the sampling phase $Q_S$ and the amplification phase $Q_A$, unlike a conventional variable gain amplifier having separate capacitors for sampling and amplification, the number of parasitic capacitors and mismatch between capacitors can be reduced to minimize a voltage gain error.

Figure 4:
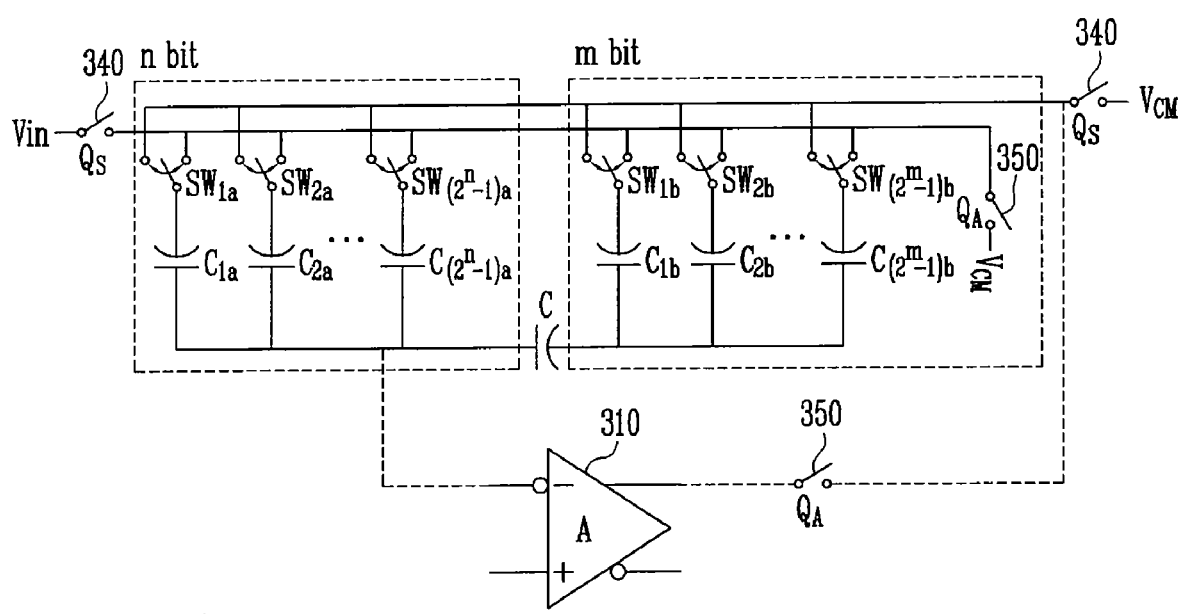
FIG. 4 illustrates an array of the variable capacitors illustrated in FIGS. 3A to 3C.

FIG. 4 illustrates arrays of the first and second variable capacitors 322 and 333 illustrated in FIGS. 3A to 3C.

Referring to FIG. 4, the first variable capacitor 322 and the second variable capacitor 333 used for the variable gain amplifier 300 of the present invention are implemented to have a variable capacitance value through a unit capacitor array, and a bit of a variable gain can be determined through the unit capacitor array.

Here, in order to obtain a variable gain amplifier having m+n bits, $2^n+2^m-1$ capacitors of capacitance C are required.

$$C_{1a}=C_{2a}=\ldots=C_{(2^n-1)a}=C_{1b}=C_{2b}=\ldots=C_{(2^m-1)b}=C$$

A method of changing variable capacitance values ($C_x$, $C_T$–$C_x$) of the first and second variable capacitors 322 and 333 through the unit capacitor array will be described below in detail.

It is assumed that a digital code is $$\text{code} = 2^m \cdot \left(p + \frac{q}{2^m}\right),$$

p switches among switches ($SW_{1a}$~$SW_{(2^n-1)a}$) included in an n-bit capacitor array at a sampling phase $Q_S$ are connected to an input voltage $V_{in}$, and q switches among switches ($SW_{1b}$~$SW_{(2^m-1)b}$) included in an m-bit capacitor array at a sampling phase $Q_S$ are in a unit capacitor array for clarity.

In this case, according to a capacitor connected to the input voltage $V_{in}$ by the p+q switches, a variable capacitance $C_x$ of a first variable capacitor 322 can be represented by the following Equation 3:

$$C_x = \left(p + \frac{q}{2^m}\right) \cdot C \quad \text{[Equation 3]}$$

Here, C denotes the capacitance of a capacitor in the unit capacitor array.

Meanwhile, at the same sampling phase $Q_S$, the remaining $2^n-p-1$ switches among the switches included in the n-bit capacitor array are connected to a common mode voltage $V_{CM}$, and the remaining $2^m-q-1$ switches among the switches included in the m-bit capacitor array are connected to the common mode voltage $V_{CM}$.

In this case, according to a capacitor connected to the common mode voltage $V_{CM}$ by $2^n-p+2^m-q-2$ switches, a variable capacitance $C_T-C_x$ of a second variable capacitor 333 can be represented by the following Equation 4:

$$C_T - C_x = \left(2^n - p - 1 + \frac{2^m - q - 1}{2^m}\right) \cdot C \quad \text{[Equation 4]}$$

Here, $C_T$ denotes the sum of capacitances of a unit capacitor array, and when all switches included in the unit capacitor array are connected to the same, it denotes the capacitance of a capacitor in the unit capacitor array, and its value can be represented by $$C_T = \left(2^n - 1 + \frac{2^m - 1}{2^m}\right) \cdot C.$$

Therefore, at the sampling phase $Q_S$, the first variable capacitor 322 has a variable capacitance of $C_x$, and the second variable capacitor 333 has a variable capacitance of $C_T-C_x$, according to the operations of the unit capacitor array.

Then, when both switches $(SW_{1a} \sim SW_{(2^n-1)a})$ included in the n-bit capacitor array and switches $(SW_{1b} \sim SW_{(2^m-1)b})$ included in the m-bit capacitor array are connected to the common mode voltage $V_{CM}$ at the amplification phase $Q_A$ following the sampling phase $Q_S$, the second variable capacitor 333 is connected to an output terminal of the operational amplifier 310, as illustrated in FIG. 3C.

Here, at the amplification phase $Q_A$, a voltage gain $A_v$ and a feedback factor $\beta$ according to the unit capacitor array can be represented by the following Equation 5:

$$A_v = \frac{C_s + C_T + C_x - C_M}{C_s + C_T - C_x + C_M} \quad \text{[Equation 5]}$$

$$\beta = \frac{C_s + C_T - C_x + C_M}{C_s + 2 \cdot C_T}$$

In Equation 5, $C_S$ denotes the capacitance of the first sampling capacitor 321, $C_T$ denotes the sum of capacitances of the unit capacitor array, $C_x$ denotes the variable capacitance of the first variable capacitor 322, $C_T-C_x$ denotes the variable capacitance of the second variable capacitor 333, and $C_M$ denotes the capacitance of an auxiliary capacitor 332.

Referring to Equation 5, taking into account an excessively large input voltage, i.e., an input voltage that exceeds a previously set critical value, a circuit should be implemented to have a voltage gain $A_v$ of 1 (0 dB) or less.

For this purpose, when a voltage gain of $A_v$ is to be less than 1, the capacitance $C_M$ of the auxiliary capacitor 332 should be set to a finite value rather than 0.

Further, when a voltage gain of 1 or higher is required, the capacitance $C_M$ of the auxiliary capacitor 332 should be set to 0 F, so that a voltage gain of 1 or higher can be implemented, like a conventional variable gain amplifier (in this case, the auxiliary capacitor may be omitted).

That is, when an input voltage is excessively high, it is impossible to implement a voltage gain of less than 1 in the conventional variable gain amplifier, since that would require a negative capacitance. However, when the variable gain amplifier 300 of the present invention requires a voltage gain of less than 1, it simply limits the capacitance $C_M$ of the auxiliary capacitor 332.

Figure 1A:
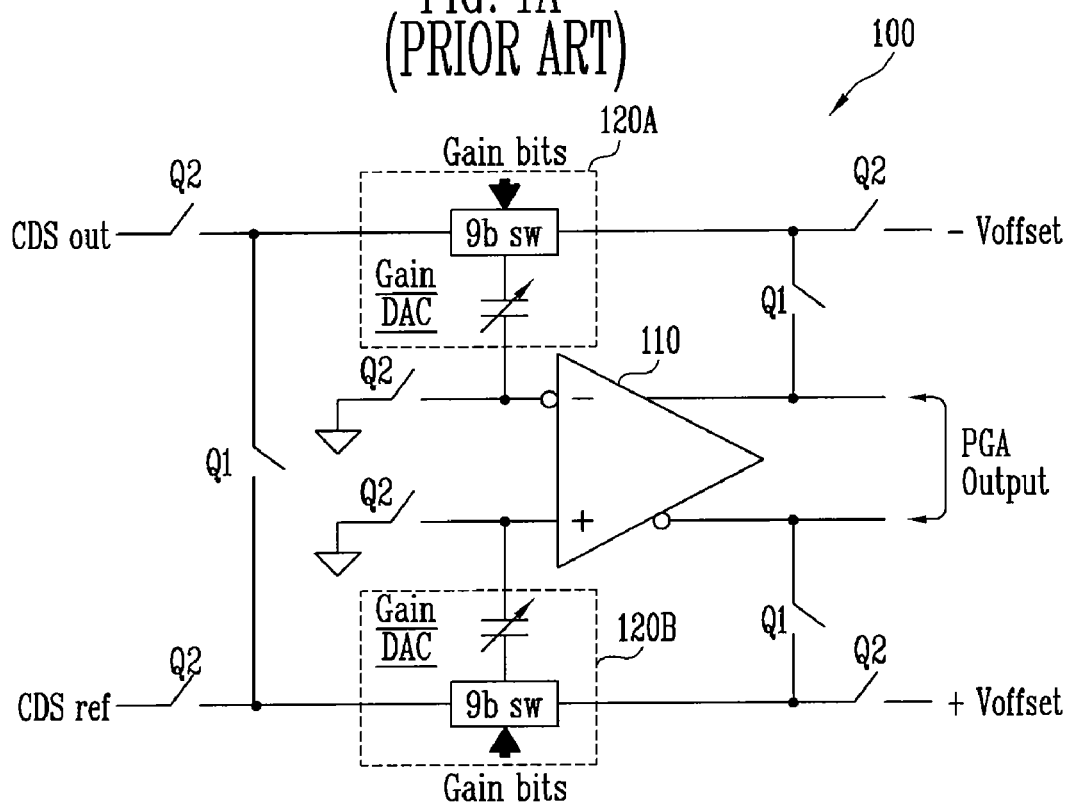
FIG. 1A is a circuit diagram of a conventional variable gain amplifier having a switched-capacitor structure.
Figure 2A:
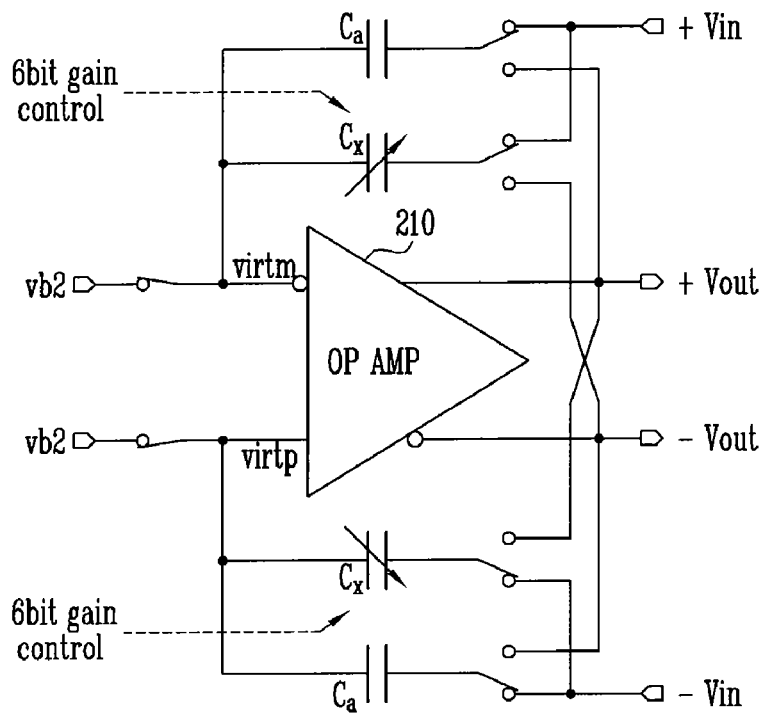
FIG. 2A is a circuit diagram of a conventional variable gain amplifier having an exponential gain control structure.
Figure 2B:
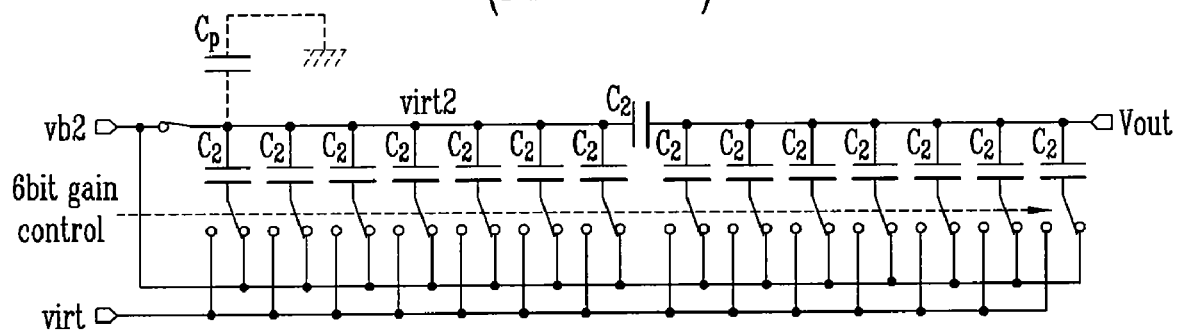
FIG. 2B illustrates a gain capacitor array of the variable gain amplifier illustrated in FIG. 2A.

In addition, referring to Equation 5, when the same voltage gain is implemented, a value of the feedback factor $\beta$ of the variable gain amplifier 300 is about 1.5 times greater than that of the variable gain amplifier 100 illustrated in FIG. 1A, and as much as $$\frac{C_M}{C_s + 2 \cdot C_T}$$

times larger than that of the variable gain amplifier 200 illustrated in FIG. 2A. Accordingly, power consumption and kT/C noise can be reduced.

Figure 1B:
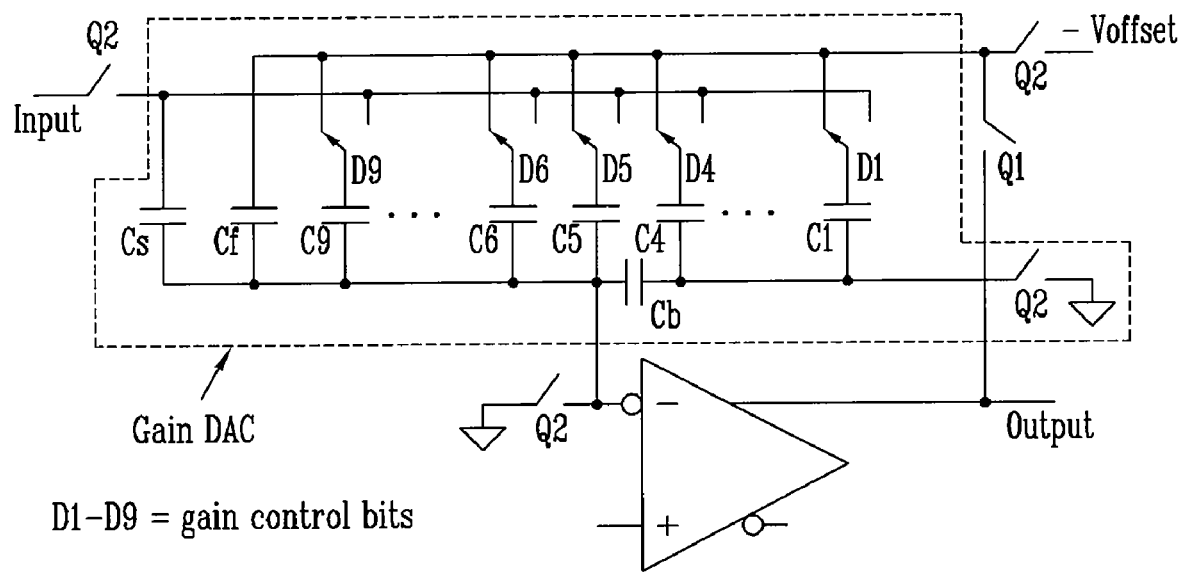
FIG. 1B illustrates an array of the variable gain capacitor illustrated in FIG. 1A.

Meanwhile, in the present exemplary embodiment, while the unit capacitor array is used to implement the first variable capacitor 322 and the second variable capacitor 333 in order to minimize mismatch of a gain capacitor array, a Boolean weighting capacitor array used in FIG. 1 may be used for certain applications.

Referring again to FIG. 3A, in the variable gain amplifier 300 of the present invention, the operational amplifier 310 is a very important factor for determining nonlinear characteristics of monotone increase of variable gain.

Figure 5A:
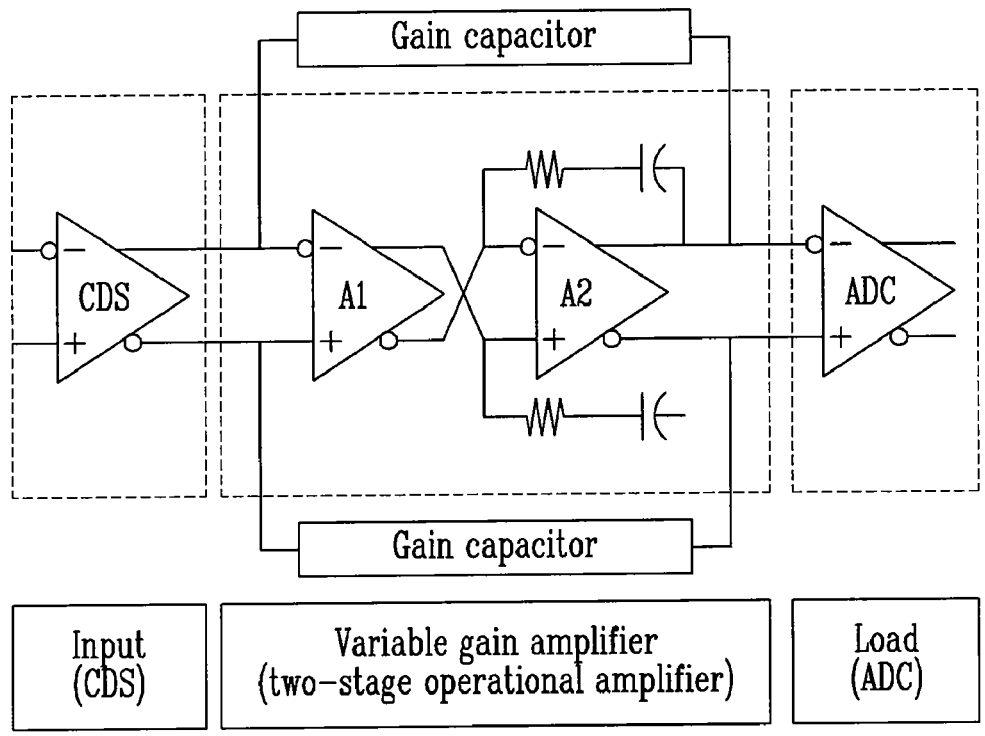
FIGS. 5A and 5B illustrate another configuration of the operational amplifier illustrated in FIGS. 3A to 3C.
Figure 5B:
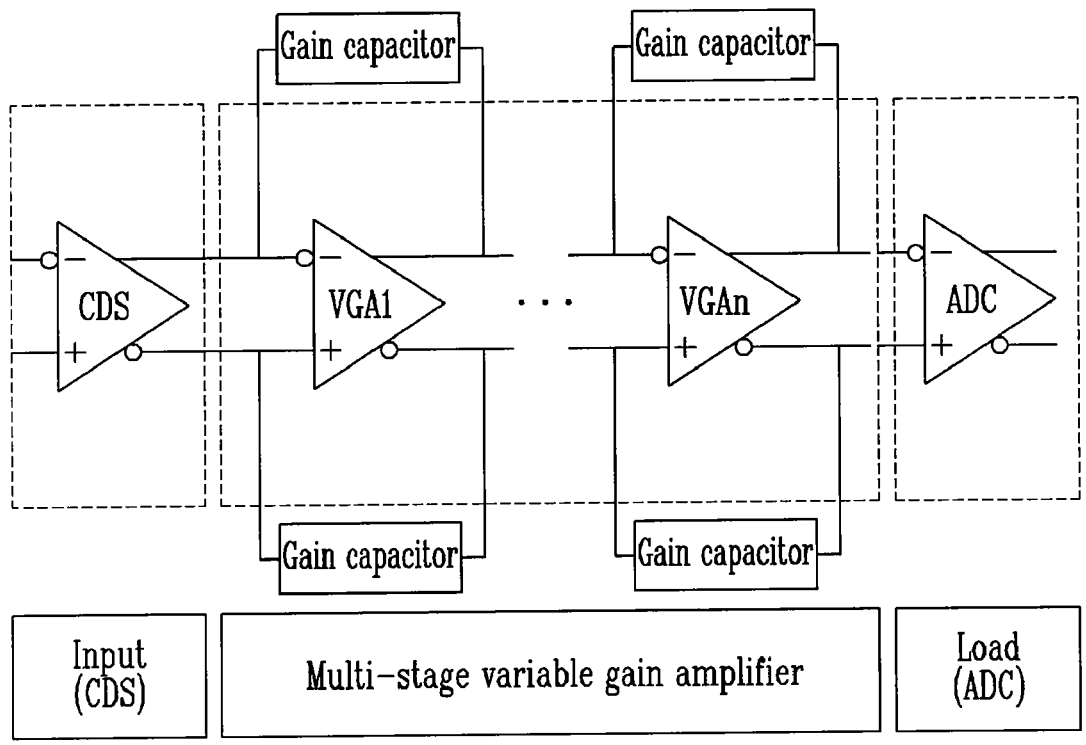

That is, in order for the variable gain amplifier 300 to have a high linearity, the operational amplifier 310 should have a gain of 60 dB or more. This necessitates use of a two-stage operational amplifier using a capacitor and resistance, as illustrated in FIG. 5A. Alternatively, a multi-stage variable gain amplifier, as illustrated in FIG. 5B, may be implemented to obtain a large variable gain section.

In a variable gain amplifier implemented by first order approximation of an exponential function, linear operation is limited to a range of −15 dB to 15 dB. Therefore, in order to design a variable gain amplifier that operates in a variable gain section of 15 dB or higher to have dB-linear characteristics, the variable gain amplifier may have a multi-stage design.

Figure 6A:
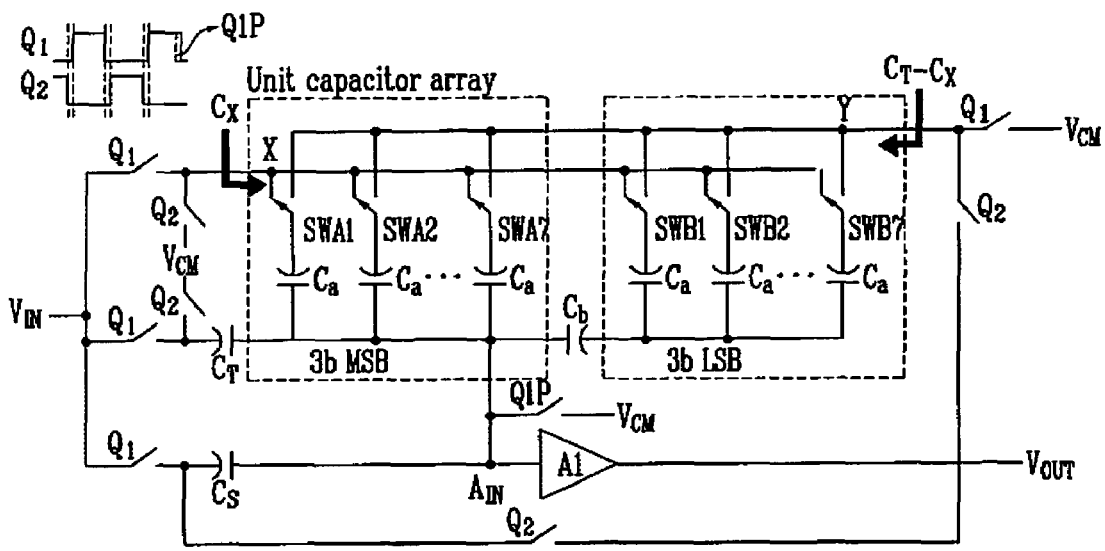
FIG. 6A illustrates the structure of a 6-bit variable gain amplifier used for a third stage when the variable gain amplifier having 6-bit resolution is implemented in three stages according to an exemplary embodiment of the present invention.

Taking into account the dB-linear characteristics, a three-stage variable gain amplifier is illustrated in FIG. 6A.

FIG. 6A illustrates the structure of a 6-bit variable gain amplifier that is used for a third stage of a three-stage variable gain amplifier having 10-bit resolution. In the structure, upper 3 bits and lower 3 bits are separately controlled based on a scaling capacitor $C_b$, and an auxiliary capacitor is not used to indicate a positive voltage gain only.

Figure 6B:
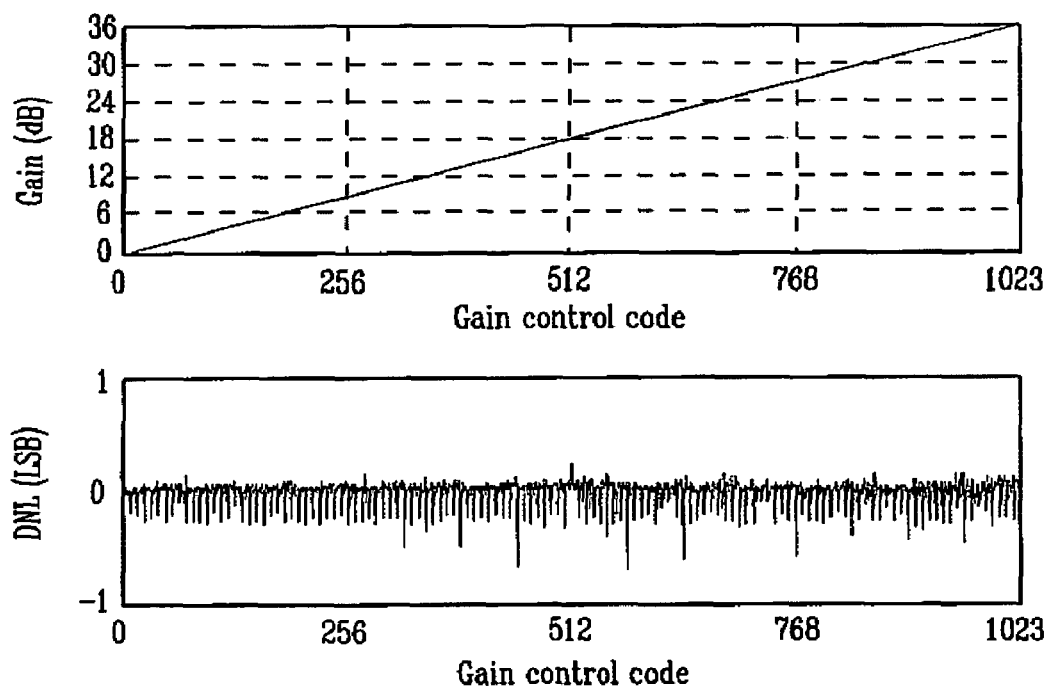
FIG. 6B illustrates measurements of gain and Differential NonLinearity (DNL) according to a gain control code of the variable gain amplifier illustrated in FIG. 6A.

FIG. 6B illustrates measurements of gain and Differential NonLinearity (DNL) according to a gain control code of the variable gain amplifier illustrated in FIG. 6A. It can be confirmed from FIG. 6B that 10-bit resolution is very well controlled within a range of 0.7 LSB.

That is, the variable gain amplifier of the present invention is excellent at monotonically increasing linearity with respect to a gain control code.

According to the present invention, since a sampling capacitor is shared and used at a sampling phase and an amplification phase, a voltage gain error caused by capacitor mismatch can be reduced.

According to the present invention, circuit design and layout can be simplified according to a unit capacitor array.

According to the present invention, a voltage gain can be easily controlled to be less than 1, or to be 1 or more, as necessary. And, power consumption and kT/C noise can be reduced by a feedback factor that is relatively large, so that gain amplification performance can be improved.

It will be understood by those of ordinary skill in the art that various changes in form and details may be made to the exemplary embodiments without departing from the spirit and scope of the present invention as defined by the following claims.

What is claimed is:

1. A switched-capacitor variable gain amplifier having high voltage gain linearity, comprising:
   first and second sampling capacitor modules, each module including a first sampling capacitor and a first variable capacitor and storing each input voltage at a sampling phase;
   an operational amplifier amplifying a difference between the input voltages at an amplification phase;
   first and second amplification capacitor modules respectively sharing the first sampling capacitor with the first and second sampling capacitor modules, and determining a voltage gain value of the input voltage according to capacitances of the shared first sampling capacitor, a second variable capacitor, and an auxiliary capacitor; and
   a plurality of sampling switches and a plurality of amplification switches, which are respectively opened and closed at the sampling and amplification phases,
   wherein the first and second variable capacitors have variable capacitance values depending on switching of a unit capacitor array.

2. The amplifier of claim 1, wherein the first sampling capacitor of the first sampling capacitor module is shared by the first amplification capacitor module and the first sampling capacitor of the second sampling capacitor module is shared by the second amplification capacitor module.

3. The amplifier of claim 1, wherein in a case of variable gain amplification of m+n bits, the unit capacitor array comprises $2^n+2^m-1$ switched-capacitors having the same capacitance value.

4. The amplifier of claim 3, wherein when p switches of an n-bit capacitor array are connected to the input voltage at the sampling phase, and q switches of an m-bit capacitor array are connected to the input voltage in the unit capacitor array, a variable capacitance value $C_x$ of the first variable capacitor is represented by the following equation:

$$C_x = \left(p + \frac{q}{2^m}\right) \cdot C$$

wherein C denotes the capacitance of a capacitor constituting the unit capacitor array.

5. The amplifier of claim 3, wherein when $2^n-p-1$ switches of an n-bit capacitor array are connected to a common mode voltage and $2^m-q-1$ switches of an m-bit capacitor array are connected to the common mode voltage at the sampling phase in the unit capacitor array, a variable capacitance value $C_T-C_x$ of the second variable capacitor is represented by the following equation:

$$C_T - C_x = \left(2^n - p - 1 + \frac{2^m-q-1}{2^m}\right) \cdot C$$

wherein C denotes the capacitance of a capacitor constituting the unit capacitor array.

6. The amplifier of claim 4, wherein when all switches of the unit capacitor array are connected to the common mode voltage at the amplification phase, a voltage gain value $A_v$ of the input voltage is represented by the following equation:

$$A_v = \frac{C_s + C_T + C_x - C_M}{C_s + C_T - C_x + C_M}$$

wherein $C_S$ denotes the capacitance of the first sampling capacitor, $C_T$ denotes the sum of capacitances of the unit capacitor array, $C_x$ denotes the variable capacitance of the first variable capacitor, $C_T-C_x$ denotes the variable capacitance of the second variable capacitor, and $C_M$ denotes the capacitance of an auxiliary capacitor.

7. The amplifier of claim 6, wherein when the input voltage is equal to or higher than a predetermined critical value, the capacitance of the auxiliary capacitor is set to a limited value so that the voltage gain value is less than 1.

8. The amplifier of claim 6, where when the input voltage is less than a predetermined critical value, the capacitance of the auxiliary capacitor is set to 0 so that the voltage gain value is 1 or higher.

9. The amplifier of claim 6, wherein a feedback factor β with respect to the input voltage at the amplification phase is represented by the following equation:

$$\beta = \frac{C_s + C_T - C_x + C_M}{C_s + 2 \cdot C_T}$$

wherein $C_S$ denotes the capacitance of the first sampling capacitor, $C_T$ denotes the sum of capacitances of the unit capacitor array, $C_x$ denotes the variable capacitance of the first variable capacitor, $C_T-C_x$ denotes the variable capacitance of the second variable capacitor, and $C_M$ denotes the capacitance of an auxiliary capacitor.

10. The amplifier of claim 1, wherein the first and second sampling capacitor modules further comprise a second sampling capacitor, and the capacitance of the second sampling capacitor is represented by the following equation:

$$C_T - C_M$$

wherein $C_T$ denotes the sum of capacitances of the unit capacitor array, and $C_M$ denotes the capacitance of an auxiliary capacitor.

11. The amplifier of claim 1, wherein the operational amplifier is a two-stage operational amplifier.

* * * * *